United States Patent
Koyama et al.

(10) Patent No.: US 7,407,733 B2
(45) Date of Patent: Aug. 5, 2008

(54) POLYMERIC COMPOUND CONTAINING A REPEATED UNIT HAVING A 2-OXATRICYCLO [4.2.1.0$^{4,8}$] NONAN-3-ONE RING AND PHOTORESIST RESIN COMPOSITION

(75) Inventors: Hiroshi Koyama, Himeji (JP); Takeshi Asada, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 282 days.

(21) Appl. No.: 10/556,186

(22) PCT Filed: May 25, 2005

(86) PCT No.: PCT/JP2005/009522

§ 371 (c)(1),
(2), (4) Date: Nov. 9, 2005

(87) PCT Pub. No.: WO2006/011287

PCT Pub. Date: Feb. 2, 2006

(65) Prior Publication Data

US 2006/0281022 A1 Dec. 14, 2006

(30) Foreign Application Priority Data

Jul. 26, 2004 (JP) ............................. 2004-217768

(51) Int. Cl.
*G03F 7/038* (2006.01)
*G03F 7/039* (2006.01)
*G03F 7/20* (2006.01)
*G03F 7/30* (2006.01)
*C08F 24/00* (2006.01)

(52) U.S. Cl. .................. 430/270.1; 430/910; 430/326; 430/325; 526/266; 526/270

(58) Field of Classification Search .................. None
See application file for complete search history.

(56) References Cited

U.S. PATENT DOCUMENTS

| 2003/0087183 | A1 | 5/2003 | Nishi et al. |
| 2005/0014087 | A1* | 1/2005 | Nishimura et al. ....... 430/270.1 |
| 2005/0089796 | A1 | 4/2005 | Funatsu et al. |

FOREIGN PATENT DOCUMENTS

| JP | 2000-26446 A | 1/2000 |
| JP | 2000-122294 A | 4/2000 |
| JP | 2002-169289 A | 6/2002 |
| JP | 2002-212174 A | 7/2002 |
| JP | 2003-147023 A | 5/2003 |
| JP | 2004-323704 A | 11/2004 |
| JP | 2005-97533 A | 4/2005 |

OTHER PUBLICATIONS

Machine-assisted English translation of JP 2002-212174, provided by JPO.*

* cited by examiner

*Primary Examiner*—Sin J. Lee
(74) *Attorney, Agent, or Firm*—Birch, Stewart, Kolasch & Birch, LLP

(57) ABSTRACT

A polymeric compound of the invention includes at least one monomer unit represented by the following formula (I);

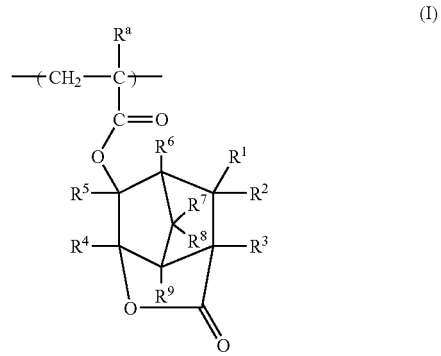

wherein $R^a$ is a hydrogen atom, a halogen atom, an alkyl group of 1 to 6 carbon atoms or an haloalkyl group of 1 to 6 carbon atoms; each of $R^1$ and $R^2$ is identical to or different from a hydrogen atom or a hydrocarbon group, provided that at least one of $R^1$ and $R^2$ is a hydrocarbon group; $R^1$ and $R^2$ may be bonded together to form a ring with an adjacent carbon atom; and each of $R^3$, $R^4$, $R^5$, $R^6$, $R^7$, $R^8$ and $R^9$ is identical to or different from a hydrogen atom or a hydrocarbon group. This polymeric compound has not only high substrate adhesion and high etching resistance but also high solubility for a resist solvent.

7 Claims, No Drawings

POLYMERIC COMPOUND CONTAINING A REPEATED UNIT HAVING A 2-OXATRICYCLO [4.2.1.0$^{4,8}$] NONAN-3-ONE RING AND PHOTORESIST RESIN COMPOSITION

TECHNICAL FIELD

The present invention relates to a photoresist polymeric compound used to perform micro-processing of a semi-conductor, a photoresist resin composition containing the polymeric compound and a process of producing a semi-conductor using the photoresist resin composition.

BACKGROUND ART

A photoresist resin used in a step of producing a semi-conductor is demanded to have a property allowing a part exposed by light-irradiation to change to alkali soluble, substrate adhesion to a silicon wafer (a base), plasma-etching resistance, transparency for used light at same time. The photoresist resin is generally applied as a solution containing a polymer which is a main agent, a photo-acid generator and some additives for adjusting the above properties.

So far, a photoresist resin containing a monomer unit having bridged alicyclic lactone skeleton as a monomer unit providing substrate adhesion and etching resistance has been proposed (for example, Japanese Unexamined Patent Application No. 2000-26446 and Japanese Unexamined Patent Application No. 2000-122294). However, when a semi-conductor is produced by using such a photoresist resin, there are some problems that an insoluble substance for a resist solvent generates in the solution and therefore micro-pattern can not be obtained accurately. It is demanded to repeat a complicated filtrating procedure to obtain micro-pattern accurately.

DISCLOSURE OF INVENTION

Problem to be Solved by the Invention

Accordingly, an object of the present invention is to provide a novel polymeric compound which is excellent for substrate adhesion and etching resistance and is high soluble for a resist solvent.

Another object of the present invention is to provide a photoresist resin composition by which micro-pattern can be formed clearly and accurately and a process of producing a semi-conductor.

Means for Solving Problem

The present inventors made intensive investigations to achieve the above object, and found that in case of using a polymeric compound containing a monomer unit having a 2-oxatricyclo[4.2.1.0$^{4,8}$]nonan-3-one ring which is a specific structure as a photoresist resin, the photoresist resin which is dissolved easily and has properties such as alkali soluble, substrate adhesion and etching resistance in balance can be obtained, a desired pattern can be formed clearly and accurately, and thereby the present invention is performed.

Namely, the present invention provides a polymeric compound containing at least one monomer unit represented by the following formula (I);

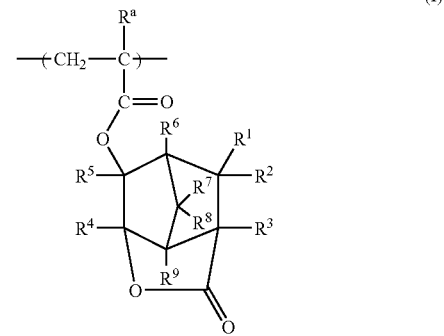

wherein $R^a$ is a hydrogen atom, a halogen atom, an alkyl group of 1 to 6 carbon atoms or an haloalkyl group of 1 to 6 carbon atoms; each of $R^1$ and $R^2$ is identical to or different from a hydrogen atom or a hydrocarbon group, provided that at least one of $R^1$ and $R^2$ is a hydrocarbon group; $R^1$ and $R^2$ may be bonded together to form a ring with an adjacent carbon atom; and each of $R^3$, $R^4$, $R^5$, $R^6$, $R^7$, $R^8$ and $R^9$ is identical to or different from a hydrogen atom or a hydrocarbon group.

Further, the polymeric compound may further contain a monomer unit having a group changing to alkali soluble by eliminating in part by acid or a monomer unit which can provide adhesion to a base, provided that the monomer unit represented by the formula (I) is excluded.

The polymeric compound may contain at least one monomer unit represented by the formula (I) and at least one monomer unit selected from the following formulae (IIa) to (IIh);

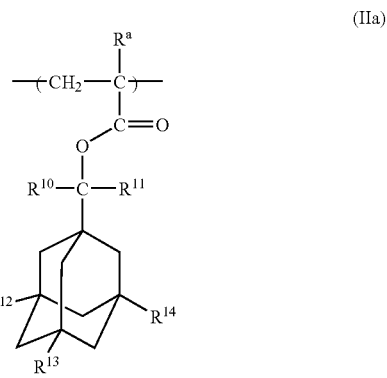

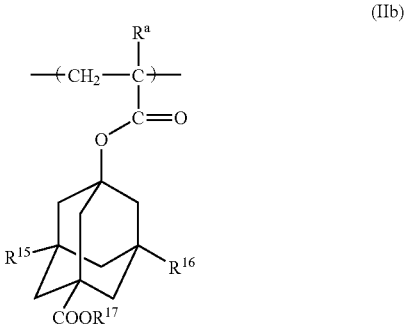

-continued (IIc) 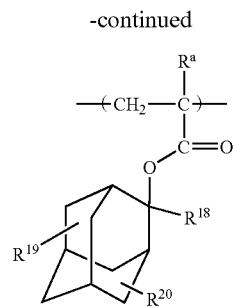

(IId) 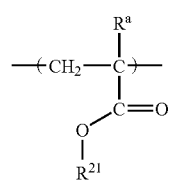

(IIe) 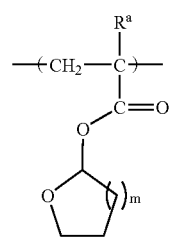

(IIf) 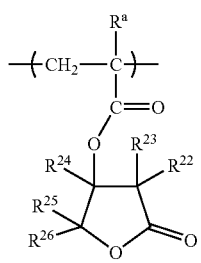

(IIg) 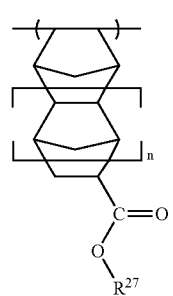

-continued (IIh) 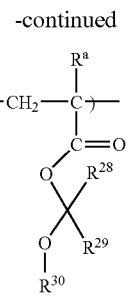

wherein $R^a$ is a hydrogen atom, a halogen atom, an alkyl group of 1 to 6 carbon atoms or an haloalkyl group of 1 to 6 carbon atoms; each of $R^{10}$ and $R^{11}$ is identical to or different from a hydrocarbon group of 1 to 8 carbon atoms; each of $R^{12}$, $R^{13}$ and $R^{14}$ is identical to or different from a hydrogen atom, a hydroxyl group or a methyl group; each of $R^{15}$ and $R^{16}$ is identical to or different from a hydrogen atom, a hydroxyl group or a —COOR$^{17}$ group, $R^{17}$ is a t-butyl group, a 2-tetrahydrofuranyl group, a 2-tetrahydropyranyl group or a 2-oxepanyl group; $R^{18}$ is a methyl group or an ethyl group; each of $R^{19}$ and $R^{20}$ is identical to or different from a hydrogen atom, a hydroxyl group or an oxo group; $R^{21}$ is a hydrocarbon group which has a tertiary carbon atom at a bonding position with an oxygen atom shown in the formula and which may have a substituent; each of $R^{22}$, $R^{23}$, $R^{24}$, $R^{25}$ and $R^{26}$ is identical to or different from a hydrogen atom or a methyl group; $R^{27}$ is a t-butyl group, a 2-tetrahydrofuranyl group, a 2-tetrahydropyranyl group or a 2-oxepanyl group; each of $R^{28}$ and $R^{29}$ is identical to or different from a hydrogen atom, an alkyl group or a fluoroalkyl group; $R^{30}$ is a hydrogen atom or an organic group; m denotes an integer of 1 to 3 and n denotes 0 or 1.

In addition, the polymeric compound may further contain at least one monomer unit selected from the following formulae (IIIa) to (IIIh);

(IIIa) 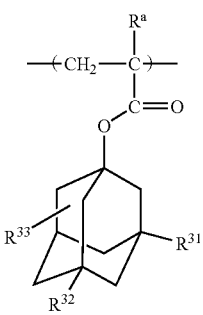

(IIIb) 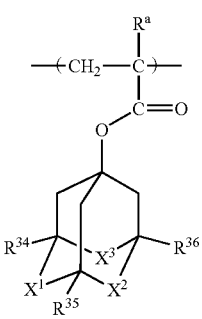

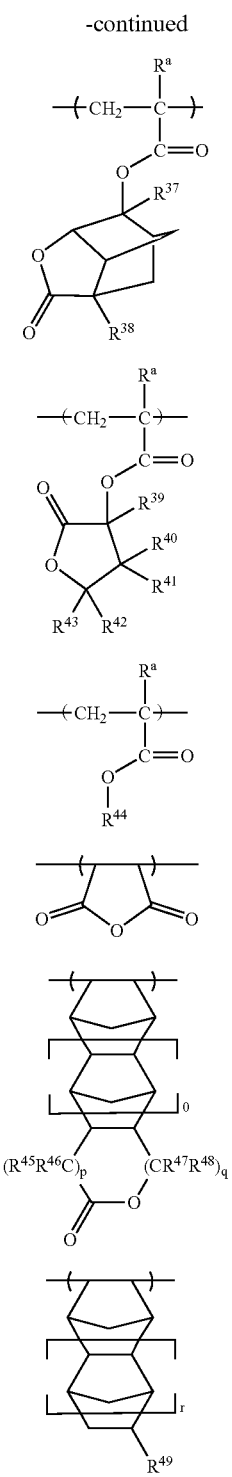

wherein $R^a$ is a hydrogen atom, a halogen atom, an alkyl group of 1 to 6 carbon atoms or an haloalkyl group of 1 to 6 carbon atoms; each of $R^{31}$ and $R^{32}$ is identical to or different from a hydrogen atom, a hydroxyl group or a carboxyl group; and $R^{33}$ is a hydroxyl group, an oxo group or a carboxyl group; each of $X^1$, $X^2$ and $X^3$ is identical to or different from —$CH_2$— or —CO—O—; each of $R^{34}$, $R^{35}$ and $R^{36}$ is identical to or different from a hydrogen atom or a methyl group; each of $R^{37}$ and $R^{38}$ is identical to or different from a hydro- gen atom or a methyl group; each of $R^{39}$, $R^{40}$, $R^{41}$, $R^{42}$ and $R^{43}$ is identical to or different from a hydrogen atom or a methyl group; $R^{44}$ is a hydrogen atom or a linear, branched, cyclic or bridged cyclic hydrocarbon group of 1 to 20 carbon atoms which may have a substituent; each of $R^{45}$, $R^{46}$, $R^{47}$ and $R^{48}$ is identical to or different from a hydrogen atom or a methyl group; $R^{49}$ is a hydrogen atom, a hydroxyl group, a hydroxymethyl group or a carboxyl group; each of o, p, q and r denotes 0 or 1.

Further, the present invention provides a photoresist resin composition comprising at least the polymeric compound and a photo-acid generator.

In addition, the present invention provides a process of producing a semi-conductor comprising a step in which the photoresist resin composition is coated on a substrate or a base to form a resist film and a pattern is formed through exposure and development.

Effect of the Invention

According to the polymeric compound of the present invention, as at least one monomer unit having a 2-oxatricyclo[4.2.1.0$^{4,8}$]nonan-3-one ring having a hydrocarbon group at 5$^{th}$ position is contained, it is capable to show not only substrate adhesion and etching resistance but also high solubility for a resist solvent. Further, by introducing a monomer unit having other functions, properties such as alkali soluble, a substrate adhesion and etching resistance can be provided in balance.

In addition, according to a photoresist resin composition and a process of producing semi-conductor in the present invention, as using the polymeric compound having excellent properties such as described above as a resist, micro-patterning can be formed in high accuracy.

BEST MODE FOR CARRYING OUT THE INVENTION

[Polymeric Compound]

The present invention contains at least one repeated unit represented by the formula (I). In the formula (I), $R^a$ is a hydrogen atom, a halogen atom, an alkyl group of 1 to 6 carbon atoms or an haloalkyl group of 1 to 6 carbon atoms, each of $R^1$ and $R^2$ is identical to or different from a hydrogen atom or a hydrocarbon group, provided that at least one of $R^1$ and $R^2$ is a hydrocarbon group. $R^1$ and $R^2$ may be bonded together to form a ring with an adjacent carbon atom and each of $R^3$, $R^4$, $R^5$, $R^6$, $R^7$, $R^8$ and $R^9$ is identical to or different from a hydrogen atom or a hydrocarbon group.

A halogen atom of $R^a$ includes a fluorine atom, a chlorine atom, a bromine atom and others. As an alkyl group of 1 to 6 carbon atoms, there may be mentioned, for example, a methyl, an ethyl, a propyl, an iso propyl, a butyl, an isobutyl, a s-butyl, a t-butyl, a hexyl group and so on. As a haloalkyl group of 1 to 6 carbon atoms, there may be mentioned a group in which at least one hydrogen atom of the alkyl group of 1 to 6 carbon atoms is substituted by a fluorine atom, for example, such as a monofluoromethyl, a difluoromethyl, a trifluoromethyl, a 2,2,2-trifluoroethyl, a tetrafluoroethyl, a 2,2,3,3,3-tetrafluoropropyl group and so on. As $R^a$ a hydrogen atom and a methyl group are particularly preferable.

A hydrocarbon group in $R^1$, $R^2$, $R^3$, $R^4$, $R^5$, $R^6$, $R^7$, $R^8$ and $R^9$ includes an aliphatic hydrocarbon group, an alicyclic hydrocarbon group, an aromatic hydrocarbon group and a group formed by being bonded by two or more of these groups. As the aliphatic hydrocarbon group, there may be mentioned, for example, a linear chained or branched chained alkyl group (an alkyl group of $C_{1-8}$ and others) such as a methyl, an ethyl, a propyl, an isopropyl, a butyl, an isobutyl, a s-butyl, a t-butyl, a hexyl, an octyl group and so on; a linear chained or branched chained alkenyl group (an alkenyl group of $C_{2-8}$ and others) such as an allyl group; a linear chained or branched chained alkynyl group (an alkynyl group of $C_{2-8}$ and others) such as a propynyl group. As the alicyclic hydrocarbon group, there may be mentioned, for example, a cycloalkyl group (3 to 8 membered cycloalkyl group and others) such as a cyclopropyl, a cyclopentyl and a cyclohexyl group; a cycloalkenyl group (3 to 8 membered cycloalkenyl group and others) such as a cyclopentenyl and a cyclohexenyl group; a bridged hydrocarbon ring group (a bridged hydrocarbon ring group of $C_{4-20}$ and others) such as an adamantyl and a norbornyl group. As the aromatic hydrocarbon group, there may be mentioned, for example, an aromatic hydrocarbon group of $C_{6-14}$ such as a phenyl and a naphtyl group. As a group formed by being bonded by an aliphatic hydrocarbon group and an aromatic hydrocarbon group, there may be mentioned an alalkyl group of $C_{7-14}$ such as a benzyl and a 2-phenylethyl group. In the hydrocarbon groups, a linear chained or branched chained alkyl group $C_{1-4}$ such as a methyl, an ethyl, a propyl and an isopropyl group is particularly preferable.

These hydrocarbon groups may have a substituent such as an alkyl group (an alkyl group of $C_{1-4}$ and so on), a haloalkyl group (a haloalkyl group of $C_{1-4}$ and so on), a halogen atom, a hydroxyl group which may be protected by a protecting group, a hydroxymethyl group which may be protected by a protecting group, a carboxyl group which may be protected by a protecting group and an oxo group. As the protecting group, a group which is usual in an organic synthesis field can be used.

As a ring formed by be bonded by $R^1$ and $R^2$ each other and combined with an adjacent carbon atom, there may be mentioned, for example, a cycloalkane ring (a 3 to 8 membered cycloalkane ring and so on) such as a cyclopropane ring, a cyclopentane ring, a cyclohexane ring and a cyclooctane ring; a cycloalkene ring (a 3 to 8 membered cycloalkene ring and so on) such as a cyclohexene ring; a bridged hydrocarbon ring (a bridged hydrocarbon ring of $C_{4-20}$ and so on) such as an adamantane ring and a norbornane ring; and others. These rings may have the same substituent as described above.

As $R^1$ or $R^2$, a hydrogen atom, an alkyl group of $C_{1-6}$, a 3 to 8 membered cycloalkyl group, an aromatic hydrocarbon group of $C_{6-14}$ and an aralkyl group of $C_{7-14}$ are preferable. It is preferable that one of $R^1$ and $R^2$ is an alkyl group of $C_{1-6}$ (particularly an alkyl group of $C_{1-4}$) and it is preferable that another of $R^1$ and $R^2$ is a hydrogen atom or an alkyl group of $C_{1-4}$ such as a methyl group. Further, it is preferable that $R^1$ and $R^2$ are bonded each other and a 3 to 8 membered cycloalkane ring is formed with an adjacent carbon atom. As $R^3$, $R^4$, $R^5$, $R^6$, $R^7$, $R^8$ and $R^9$, a hydrogen atom and an alkyl group of $C_{1-6}$ is preferable and a hydrogen atom and an alkyl group of $C_{1-4}$ such as a methyl group particularly preferable.

A monomer unit represented by the formula (I) can be introduced into a polymer by being subjected a 9-unsaturated acyloxycarbonyl-2-oxatricyclo[4.2.1.0$^{4,8}$]nonan-3-one derivative to (co)polymerization represented by the formula (1):

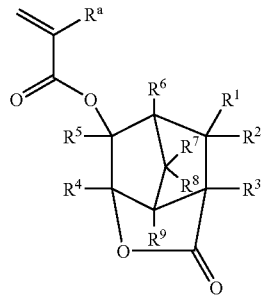

(1)

wherein $R^a$ is a hydrogen atom, a halogen atom, an alkyl group of 1 to 6 carbon atoms or a haloalkyl group of 1 to 6 carbon atoms; each of $R^1$ and $R^2$ is identical to or different from a hydrogen atom or a hydrocarbon group, provided that at least one of $R^1$ and $R^2$ is a hydrocarbon group; $R^1$ and $R^2$ may be bonded each other to from a ring with an adjacent carbon atom; each of $R^3$, $R^4$, $R^5$, $R^6$, $R^7$, $R^8$ and $R^9$ is identical to or different from a hydrogen atom or a hydrocarbon group.

As typical examples of a 9-unsaturated acyloxycarbonyl-2-oxatricyclo[4.2.1.0$^{4,8}$]nonan-3-one derivative represented by the formula (1), there may be mentioned 9-(meth)acryloyloxy-5-methyl-2-oxatricyclo[4.2.1.0$^{4,8}$]nonan-3-one, 9-(meth)acryloyloxy-4,5-dimethyl-2-oxatricyclo[4.2.1.0$^{4,8}$]nonan-3-one, 9-(meth)acryloyloxy-5,5-dimethyl-2-oxatricyclo[4.2.1.0$^{4,8}$]nonan-3-one, 5-ethyl-9-(meth)acryloyloxy-2-oxatricyclo [4.2.1.0$^{4,8}$]nonan-3-one, 9-(meth)acryloyloxy-5-propyl-2-oxatricyclo[4.2.1.0$^{4,8}$]nonan-3-one, 5-butyl-9-(meth)acryloyloxy-2-oxatricyclo[4.2.1.0$^{4,8}$]nonan-3-one, 9-(meth)acryloyloxy-5,6-dimethyl-2-oxatricyclo[4.2.1.0$^{4,8}$]nonan-3-one, 9-(meth)acryloyloxy-5,8-dimethyl-2-oxatricyclo[4.2.1.0$^{4,8}$]nonan-3-one, 9-(meth)acryloyloxy-5,6,8-trimethyl-2-oxatricyclo[4.2.1.0$^{4,8}$]nonan-3-one and so on.

An α-unsaturated acyloxy-γ-butyrolactone derivative can be obtained by a method described, for example, in Japanese Unexamined Patent Application No. 2002-212174.

A polymeric compound of the present invention contains at least one monomer unit (a repeated unit), maybe described as "a monomer unit 1" hereinafter, represented by the above formula (I) as a constructing unit constructing a polymer molecular. The monomer unit 1 works as an adhesion-giving unit improving substrate adhesion by having a 2-oxatricyclo [4.2.1.0$^{4,8}$]nonan-3-one ring containing a lactone ring which is high hydrophilic. Further, etching resistance is improved by having an alicyclic ring. In addition, as a hydrocarbon group is bonded at 5$^{th}$ position of a 2-oxatricyclo[4.2.1.0$^{4,8}$] nonan-3-one ring, solubility for a resist solvent, for example, a glycol ether such as propylene glycol monomethylether and a glycol ether ester such as propylene glycol monomethylether acetate. Therefore, a polymer containing the above monomer unit 1 can be used as a suitable photoresist resin. It is preferable that a polymeric compound of the present invention additionally contains a monomer unit having a group which changes to alkali soluble by eliminating a part of it by acid or a monomer unit which can provide adhesion property for substrate, for example, a monomer unit having a lactone skeleton and/or a monomer unit having an alicyclic skeleton having a hydroxyl group, a mercapto group or a carboxyl group, [except a monomer unit represented by the formula (I)].

As a preferable mode of the present invention, at least one monomer unit represented by the above formula (I) and at least one monomer unit, a repeated unit (maybe described as "a monomer unit 2" hereinafter), selected from the above formulae (IIa) to (IIh) are contained.

$R^a$ in the formulae (IIa) to (IIh) is the same as described above. In the formula (IIa), as a hydrocarbon of 1 to 8 carbon atoms in $R^{10}$ and $R^{11}$, there may be mentioned an alkyl group of $C_{1-8}$ such as a methyl, an ethyl, a propyl, an isopropyl, a butyl, an isobutyl, a s-butyl, a pentyl, an isopentyl, a 1-methylbutyl, a 1-ethylpropyl, a hexyl, an isohexyl, a 1-methylpentyl, a 1-ethylbutyl, a heptyl, a 1-methylhexyl, an octyl and a 1-methylheptyl group; a cycloalkyl of $C_{3-8}$ such as a cyclopropyl, a cyclopentyl, a cyclohexyl, a cycloheptyl and a cyclooctyl group; a phenyl group; and others. In these, an alkyl group of $C_{1-3}$ such as a methyl, an ethyl and an isopropyl group is preferable.

In the formula (IId), as a hydrocarbon group having a tertiary carbon atom at a position bonding with an oxygen atom represented by the formula in $R^{21}$, there may be mentioned, for example, a t-butyl group, a t-amyl group and others. These hydrocarbon groups may have a substituent.

In the formula (IIh), as an alkyl group in $R^{28}$ and $R^{29}$, there may be mentioned a linear chained or branched chained alkyl group, for example, an alkyl group of $C_{1-6}$, such as a methyl, an ethyl, a propyl, an isopropyl, a s-butyl, a pentyl and a hexyl group. Further, as a fluoroalkyl group, there may be mentioned a group in which at least one hydrogen atom of the above alkyl group is substituted by a fluorine atom, for example, a monofluoro methyl, a difluoro methyl, a trifluoromethyl, a 2,2,2-trifluoro ethyl, a tetrafluoro ethyl, a 2,2,3,3,3-tetrafluoro propyl group and so on. As $R^{28}$ and $R^{29}$, a hydrogen atom, an alkyl group of $C_{1-3}$, a fluoro alkyl group of $C_{1-3}$ and others are particularly preferable.

In the formula (IIh), as an organic group in $R^{30}$, there may be mentioned a group having a hydrocarbon group and/or a hetero cyclic group. As the hydrocarbon group, there may be mentioned the same thing as a hydrocarbon group in $R^1$ and $R^2$. As the hetero cyclic group, there may be mentioned a hetero cyclic group having at least one hetero atom selected from an oxygen atom, a sulfur atom and a nitrogen atom.

As a preferable organic group, there may be mentioned an alkyl group of $C_{1-8}$, an organic group having a cyclic skeleton and others. A ring constructing the above cyclic skeleton includes a mono-or-poly cyclic and non-aromatic-or-aromatic carbon ring or hetero ring. In these, a mono-or-poly cyclic non-aromatic hydrocarbon and a lactone ring (which may be condensed by a none-aromatic carbon ring) is particularly preferable. As the mono cyclic non-aromatic hydrocarbon, there may be mentioned, for example, a about 3 to 15 membered cycloalkane ring such as a cyclopentane ring, a cyclohexane ring and so on.

As a polycyclic none-aromatic hydrocarbon ring, a bridged carbon ring, there may be mentioned, for example, an adamantane ring, a norbornane ring, a norbornene ring, a bornane ring, an isobornane ring and an adamantane ring; a ring containing a norbornane ring or a norbornene ring such as a norbornane ring, a norbornene ring, a bornane ring, an isobornane ring, a tricyclo[5.2.1.0$^{2,6}$]decane ring and a tetracyclo[4.4.0.1$^{2,5}$.1$^{7,10}$]dodecane ring; a ring hydrogenating a polycyclic aromatic condensation ring such as a perhydroindene ring, a decalin ring (a perhydronaphthalene ring), a perhydrofluorene ring (a tricyclo[7.4.0.0$^{3,8}$]tridecane ring), a perhydroanthracene ring, (preferably a ring hydrogenated perfectly); a 2 cyclic, 3 cyclic or 4 cyclic bridged carbon ring such as a tricyclo[4.2.2.1$^{2,5}$]undecane ring (for example, a bridged carbon ring of about 6 to 20 carbon atoms); and others. As the above lactone ring, there may be mentioned, for example, γ-butyrolactone ring, a 4-oxatricyclo[4.3.1.1$^{3,8}$]undecane-5-on ring, a 4-oxatricyclo[4.2.1.0$^{3,7}$]nonane-5-on ring, a 4-oxatricyclo[5.2.1.0$^{2,6}$]decane-5-on ring and so on.

A ring constituting the cyclic skeleton may have a substituent such as an alkyl group such as a methyl group (for example, an alkyl group of $C_{1-4}$ and others), a haloalkyl group such as a trifluoromethyl group (for example, a haloalkyl group of $C_{1-4}$ and others), a halogen atom such as a chlorine atom and a fluorine atom, a hydroxyl group which may be protected by the protecting group, a hydroxyalkyl group which may be protected by the protecting group, a mercapto group which may be protected by the protecting group, a carboxyl group which may be protected by the protecting group, an amino group which may be protected by the protecting group, a sulfone group which may be protected by the protecting group. As the protecting group, a protecting group known in an organic synthesis field can be used.

A ring constituting the cyclic skeleton may be directly bonded with an oxygen atom written in the formula (IIh) (an oxygen atom at adjacent position of $R^{30}$) or may be bonded through a combining-group. As the combining-group, there may be mentioned a linear or branched chained alkylene group such as a methylene, a methylmethylene, a dimethylmethylene, an ethylene, a propylene, a trimethylene group; a carbonyl group; an oxygen atom (an ether bond; —O—); an oxycarbonyl group (an ester bond; —COO—); an aminocarbonyl (an amide bond; —CONH—); a group bonded by plural numbers of these groups; and others.

A monomer unit represented by the formula (IIa) is allowed to form a free carboxyl group by acid by eliminating a portion containing an adamantane skeleton from a carboxylic acid part bonded to a main chain. A monomer unit represented by the formula (IIb) is allowed to form a free carboxylic acid by de-protecting a carboxyl group, which is protected by a protecting group and is boned to an adamantan skeleton, by acid. Further, a monomer unit represented by the formula (IIc) is allowed to form a free carboxyl group by eliminating an adamantane skeleton from a carboxylic acid part bonded to a main chain by acid. In addition, a monomer unit represented by the formulae (IId) (IIe) (IIf) (IIg) or (IIh) is also allowed to form a free carboxylic acid by decomposing a carboxylic acid ester part and eliminating by acid. Therefore, the above monomer unit 2 works as an alkali soluble unit which allows a resin to change to soluble at alkali development.

In addition, monomer units represented by the formulae (IIa) (IIb) (IIc) or (IIg) and a monomer unit in which $R^{30}$ in the formula (IIh) is a group having a non-aromatic carbon ring has advantageous properties that transparency is excellent and etching resistance is extremely high by having an alicyclic carbon skeleton. Further, a monomer unit in which at least one of $R^{12}$ to $R^{14}$ in the formula (IIa) is a hydroxyl group, a monomer unit represented by the formula (IIf) and a monomer unit in which $R^{30}$ in the formula (IIh) is a group having a lactone ring are high hydrophilicity and also have adhesion function.

In preferable mode of a polymeric compound of the present invention, at least one monomer unit (a repeated unit), which may be described as "a monomer unit 3" hereinafter, selected from monomer units represented by the above formulae (IIIa) to (IIIh) may be contained in addition to the above monomer unit 1 or the monomer unit 1 and 2.

$R^a$ in the formulae (IIIa) to (IIIh) is the same as described above. In $X^1$ to $X^3$ of the formula (IIIb), a direction of —CO—O— group isn't restricted. Further, as a linear or branched chained, or cyclic or bridged-cyclic hydrocarbon group (a bridged cyclic group) of 1 to 20 carbon atoms in $R^{44}$ of the formula (IIIe), there may be mentioned a linear or branched chained aliphatic hydrocarbon group of 1 to 20 carbon atoms (particularly an alkyl group) such as a methyl, an ethyl, a propyl, an iso propyl, a butyl, an isobutyl, a t-butyl, a pentyl, a hexyl, an octyl, a decyl, a dodecyl, a tetradecyl and an octadecyl group; a cycloalkyl or cycloalkenyl group of 3 to 20 carbon atoms such as a cyclopentyl, a cyclohexyl, a cyclooctyl and a cyclododecyl group; a bridged-cyclic hydrocarbon group (a bridged cyclic hydrocarbon group) of 6 to 20 carbon atoms corresponding to a perhydroindene ring, a perhydrofluorene ring, a perhydronaphthalene ring (a decalin ring), a perhydroanthracene ring, a norbornylane ring, a norbornene ring, a pinane ring, a bornane ring, a isobornane ring, a tricyclo[5.2.1.0$^{2,6}$]decane ring, a tetracyclo[4.4.0.1$^{2,5}$.1$^{7,10}$]dodecane ring and others; a group bonding the hydrocarbon group such as a tricyclo[5.2.1.0$^{2,6}$]decylmethyl group, a tetracyclo[4.4.0.1$^{2,5}$.1$^{7,10}$]dodecylmethyl group and a 2-norbornylmethyl group. These hydrocarbon groups may have a substituent such as an alkyl group, a halogen atom, a hydroxyl group which may be protected by a protecting group, a hydroxymethyl group which may be protected by a protecting group, a carboxyl group which may be protected by a protecting group (for example, a carboxyl group, a t-butyloxycarbonyl group, a 2-tetrahydrofulanyloxycarbonyl group, 2-tetrahydropyranyloxycarbonyl group, a 2-oxepanyloxycarbonyl group and others) and an oxo group. As the protecting group, a protecting group known in an organic synthesis field can be used.

A monomer unit represented by the above formula (IIIa) have a function that adhesion for a substrate is improved because a group (a hydroxyl group, a carboxyl group, an oxo group) which is high hydrophilic is bonded to an adamantan skeleton. Further, a monomer unit represented by the formulae (IIIa), (IIIb) (a monomer unit in which all of $X^1$ to $X^3$ is a methylene group, others), (IIIc), (IIIe) (a monomer unit in which $R^{44}$ is a cyclic or bridged-cyclic hydrocarbon group), (IIIg) and (IIIh) contributes to improve transparency, etching resistance and so on because of having an alicyclic carbon skeleton. A monomer unit represented by the formulae (IIIb) (a monomer unit in which at least one of $X^1$ to $X^3$ is a —CO—O— group), (IIIc), (IIId) and (IIIg) and a monomer unit represented by the formulae (IIIe) (a monomer unit in which $R^{44}$ is a hydrogen atom), (IIIf) and (IIIh) (a monomer unit in which $R^{49}$ is a hydroxyl group, a hydroxymethyl group or a carboxyl group) have adhesion-providing function because of containing a hydrophilic group. In this way, these monomer units can accurately adjust balance of various functions needed for a photoresist resin according to uses by adding each of the monomer units into a polymer because of providing various functions based on the structure. In addition, a polymeric compound of the present invention may contain a monomer unit except for described above if necessary in order to adjust the various properties.

In a polymeric compound of the present invention, a content of the monomer unit 1 is, for example, 10 to 90 mole %, preferably 20 to 70 mole %, more preferably about 30 to 50 mole % based on all of monomer units constituting a polymer. Further, in a preferable polymer, a monomer unit 2 is contained, for example, within 10 to 90 mole %, preferably 20 to 70 mole %, more preferably about 30 to 50 mole % based on all of monomer units constituting a polymer. In addition, in a polymeric compound containing a monomer unit 3, a monomer unit 3 content is, for example, within 0 to 50 mole %, preferably 0 to 40 mole %, more preferably about 10 to 30 mole % based on all of monomer units constituting a polymer.

In a combination of the monomer unit for a polymeric compound of the present invention, there may be mentioned the followings as a particularly preferable combination.

(1) A combination constituted with at least one monomer unit represented by the formula (I) and at least one monomer unit selected from the formula (IIa) to (IIh) (particularly at least one monomer unit selected from the formulae (IIa), (IIb) and (IIc)).
(2) A combination constituted with at least one monomer unit represented by the formula (I), at least one monomer unit selected from the formula (IIa) to (IIh) (particularly at least one monomer unit selected from the formulae (IIa), (IIb) and (IIc)) and at least one monomer unit selected from the formula (IIIa) to (IIIh) (particularly at least one monomer unit selected from the formulae (IIIa), (IIIf) and (IIIh)).
(3) A combination constituted with at least one monomer unit represented by the formula (I) and at least one monomer unit selected from the formula (IIIa) to (IIIh) (particularly at least one monomer unit selected from the formulae (IIIa), (IIIf) and (IIIh)).

A polymeric compound of the present invention is preferable in a scope of 19.5 to 24.5 $(J/cm^3)^{1/2}$ in a value of solubility parameter (SP value) according to Fedors method [Reference; Poly. Eng. Sci., 14,147(1974)]. A resist coating film formed by coating a photoresist resin composition containing a polymeric compound having like a solubility parameter on a semi-conductor base (silicon wafer) is excellent for adhesion to a base and can form a pattern of high resolution through alkali developing. If SP value is lower than 19.5 $(J/cm^3)^{1/2}$, a problem that a pattern is peeled off and can not be maintained is easily occurred because adhesion to a base is decreased. Further, if SP value is larger than 24.5 $(J/cm^3)^{1/2}$, a coating is likely to be hard by repelled from a base and, in addition, affinity to alkali developer is increased and, as a result, a contrast of solubility between a exposure part and an non-exposure part is getting worse so that resolution is easily decreased.

A weight-average molecular weight (Mw) of the polymeric compound is, for example, about 5000 to 50000, preferably 7000 to 20000 and a molecular-weight distribution (Mw/Mn) is, for example, about 1.8 to 3.5. Further, the Mn is a number-average molecular weight and each of Mn and Mw is a value in terms of polystyrene.

An ethylene unsaturated compound corresponding to each of monomer units represented by the above formulae (IIg), (IIIf), (IIIg) and (IIIh) as a (co-)monomer or a (meth)acrylic acid or ester thereof corresponding to each of monomer units represented by the formulae (I), (IIa) to (IIf), (IIh) and (IIIa) to (IIIe) as a (co-)monomer is subjected to polymerization and can form.

[Monomer Unit of the Formula (I)]

A monomer corresponding to the monomer unit of the above formula (I) is represented by the formula (1). A monomer represented by the formula (1) can be used alone or in a combination of two or more sorts. Further, a compound represented by the formula (1) has a stereoisomer and only a stereoisomer may be used or plural stereoisomers may be also used in the present invention.

[Monomer Unit of the Formula (IIa)]

As typical examples of the monomer corresponding to the monomer unit of the formula (IIa), there may be mentioned the following compounds. 1-(1-(meth)acryloyloxy-1-methylethyl)adamantane, 1-hydroxy-3-(1-(meth)acryloyloxy-1-methylethyl)adamantane, 1-(ethyl-1-(meth)acryloyloxypropyl)adamantane, 1-hydroxy-3-(ethyl-1-(meth)acryloyloxypropyl)adamantane, 1(1-(meth)acryloyloxy-1-methylpropyl)adamantane, 1-hydroxy-3-(1-(meth)acryloyloxy-1-methylpropyl)adamantane, 1-(1-(meth)acryloyloxy-1,2-dimethylpropyl)adamantane, 1-hydroxy-3-(1-(meth)acryloyloxy-1,2-dimethylpropyl)adamantane, 1,3-dihydroxy-5-(1-(meth)acryloyloxy-1-methylethyl)adamantane, 1-(ethyl-1-(meth)acryloyloxypropyl)-3,5-dihydroxyadamantane, 1,3-dihydroxy-5-(1-(meth)acryloyloxy-1-methylpropyl)adamantane, 1,3-dihydroxy-5-(1-(meth)acryloyloxy-1,2-dimethylpropyl)adamantane.

[Monomer Unit of the Formula (IIb)]

As typical examples of the monomer corresponding to the monomer unit of the formula (IIb), there may be mentioned the following compounds. 1-t-butoxycarbonyl-3-(meth)acryloyloxyadamantane, 1,3-bis(t-butoxycarbonyl)-5-(meth)acryloyloxyadamantane, 1-t-butoxycarbonyl-3-hydroxy-5-(meth)acryloyloxyadamantane, 1-(2-tetrahydropyranyloxycarbonyl)-3-(meth)acryloyloxyadamantane, 1,3-bis(2-tetrahydropyranyloxycarbonyl)-5-(meth)acryloyloxyadamantane, 1-hydroxy-3-(2-tetrahydropyranyloxycarbonyl)-5-(meth)acryloyloxyadamantane.

[Monomer Unit of the Formula (IIc)]

As typical examples of the monomer corresponding to the monomer unit of the formula (IIc), there may be mentioned the following compounds. 2-(meth)acryloyloxy-2-methyladamantane, 1-hydroxy-2-(meth)acryloyloxy-2-methyladamantane, 5-hydroxy-2-(meth)acryloyloxy-2-methyladamantane, 1,3-dihydroxy-2-(meth)acryloyloxy-2-methyladamantane, 1,5-dihydroxy-2-(meth)acryloyloxy-2-methyladamantane, 1,3-dihydroxy-6-(meth)acryloyloxy-6-methyladamantane, 2-(meth)acryloyloxy-2-ethyladamantane, 1-hydroxy-2-(meth)acryloyloxy-2-ethyladamantane, 5-hydroxy-2-(meth)acryloyloxy-2-ethyladamantane, 1,3-dihydroxy-2-(meth)acryloyloxy-2-ethyladamantane, 1,5-dihydroxy-2-(meth)acryloyloxy-2-ethyladamantane, 1,3-dihydroxy-6-(meth)acryloyloxy-6-ethyladamantane.

[Monomer Unit of the Formula (IId)]

As typical examples of the monomer corresponding to the monomer unit of the formula (IId), there may be mentioned the following compounds. t-butyl(meth)acrylate.

[Monomer Unit of the Formula (IIe)]

As typical examples of the monomer corresponding to the monomer unit of the formula (IIe), there may be mentioned the following compounds. 2-tetrahydropyranyl(meth)acrylate, 2-tetrahydrofuranyl(meth)acrylate.

[Monomer Unit of the Formula (IIf)]

As typical examples of the monomer corresponding to the monomer unit of the formula (IIf), there may be mentioned the following compounds. β-(meth)acryloyloxy-γ-butyrolactone, β-(meth)acryloyloxy-α,α-dimethyl-γ-butyrolactone, β-(meth)acryloyloxy-γ,γ-dimethyl-γ-butyrolactone, β-(meth)acryloyloxy-α,α,β-trimethyl-γ-butyrolactone, β-(meth)acryloyloxy-β,γ,γ-trimethyl-γ-butyrolactone, β-(meth)acryloyloxy-α,α,β,γ,γ-pentamethyl-γ-butyrolactone.

[Monomer Unit of the Formula (IIg)]

As typical examples of the monomer corresponding to the monomer unit of the formula (IIg), there may be mentioned the following compounds. 5-t-butoxycarbonylnorbornene, 9-t-butoxycarbonyl-tetracyclo[6.2.1.1$^{3,6}$.0$^{2,7}$]dodeca-4-ene, 5-(2-tetrahydropyranyloxycarbonyl)norbornene, 9-(2-tetrahydropyranyloxycarbonyl)tetracyclo[6.2.1.1$^{3,6}$.0$^{2,7}$]dodeca-4-ene.

[Monomer Unit of the Formula (IIh)]

As typical examples of the monomer corresponding to the monomer unit of the formula (IIh), there may be mentioned the following compounds. 1-(adamantane-1-yloxy)ethyl (meth)acrylate, 1-(adamantane-1-ylmethoxy)ethyl(meth)acrylate, 1-[2-(adamantane-1-yl)ethoxy]ethyl(meth)acrylate, 1-(3-hydroxyadamantane-1-yloxy)ethyl(meth)acrylate, 1-(norbornane-2-yloxy)ethyl(meth)acrylate, 1-(norbornane-2-ylmethoxy)ethyl(meth)acrylate, 1-(2-methylnorbornane-2-yloxy)ethyl(meth)acrylate, 1-[1-(norbornane-2-yl)-1-methylethoxy]ethyl(meth)acrylate, 1-(3-methylnorbornane-2-ylmethyloxy)ethyl(meth)acrylate, 1-(bornyloxy)ethyl(meth)acrylate, 1-(isobornyloxy)ethyl(meth)acrylate; 1-[1-(meth)acryloyloxyethoxy]-4-oxatricyclo[4.3.1.1$^{3,8}$]undecan-5-one, 2-[1-(meth)acryloyloxyethoxy]-4-oxatricyclo [4.2.1.0$^{3,7}$]nonan-5-one, 8-[1-(meth)acryloyloxyethoxy]-4-oxatricyclo[5.2.1.0$^{2,6}$]decan-5-one, 9-[1-(meth)acryloyloxyethoxy]-4-oxatricyclo[5.2.1.0$^{2,6}$]decane-5-on, α-[1-(meth)acryloyloxyethoxy]-γ,γ-dimethyl-γ-butyrolactone, 3-[1-(meth)acryloyloxyethoxy]-2-oxo-1-oxaspiro[4.5]decane, α-[1-(meth)acryloyloxyethoxy]-γ-butyrolactone, α-[1-(meth)acryloyloxyethoxy]-α,γ,γ-trimethyl-γ-butyrolactone, α-[1-(meth)acryloyloxyethoxy]-β,β-dimethyl-γ-butyrolactone.

[Monomer Unit of the Formula (IIIa)]

As typical examples of the monomer corresponding to the monomer unit of the formula (IIIa), there may be mentioned the following compounds. 1-hydroxy-3-(meth)acryloyloxyadamantane, 1,3-dihydroxy-5-(meth)acryloyloxyadamantane, 1-carboxy-3-(meth)acryloyloxyadamantane, 1,3-dicarboxy-5-(meth)acryloyloxyadamantane, 1-carboxy-3-hydroxy-5-(meth)acryloyloxyadamantane, 1-(meth)acryloyloxy-4-oxoadamantane, 3-hydroxy-1-(meth)acryloyloxy-4-oxoadamantane, 7-hydroxy-1-(meth)acryloyloxy-4-oxoadamantane.

[Monomer Unit of the Formula (IIIb)]

As typical examples of the monomer corresponding to the monomer unit of the formula (IIIb), there may be mentioned the following compounds. 1-(meth)acryloyloxy-4-oxatricyclo[4.3.1.1$^{3,8}$]undecan-5-one, 1-(meth)acryloyloxy-4,7-dioxatricyclo[4.4.1.1$^{3,9}$]dodecane-5,8-dione, 1-(meth)acryloyloxy-4,8-dioxatricyclo[4.4.1.1$^{3,9}$]dodecane-5,7-dione, 1-(meth)acryloyloxy-5,7-dioxatricyclo[4.4.1.1$^{3,9}$]dodecane-4,8-dione.

[Monomer Unit of the Formula (IIIc)]

As typical examples of the monomer corresponding to the monomer unit of the formula (IIIc), there may be mentioned the following compounds. 2-(meth)acryloyloxy-4-oxatricyclo[4.2.1.0$^{3,7}$]nonan-5-one, 2-(meth)acryloyloxy-2-methyl-4-oxatricyclo[4.2.1.0$^{3,7}$]nonan-5-one.

[Monomer Unit of the Formula (IIId)]

As typical examples of the monomer corresponding to the monomer unit of the formula (IIId), there may be mentioned the following compounds. α-(meth)acryloyloxy-γ-butyrolactone, α-(meth)acryloyloxy-α-methyl-γ-butyrolactone, α-(meth)acryloyloxy-β,β-dimethyl-γ-butyrolactone, α-(meth)acryloyloxy-α,β,β-trimethyl-γ-butyrolactone, α-(meth)acryloyloxy-γ,γ-dimethyl-γ-butyrolactone, α-(meth)acryloyloxy-α,γ,γ-trimethyl-γ-butyrolactone, α-(meth)acryloyloxy-β,β,γ,γ-tetramethyl-γ-butyrolactone, α-(meth)acryloyloxy-α,β,β,γ,γ-pentamethyl-γ-butyrolactone.

[Monomer Unit of the Formula (IIIe)]

As typical examples of the monomer corresponding to the monomer unit of the formula (IIIe), there may be mentioned the following compounds. (meth)acrylic acid, methyl(meth)acrylate, ethyl(meth)acrylate, isopropyl(meth)acrylate, Gn-butyl(meth)acrylate, cyclohexyl(meth)acrylate, decahydronaphtyl(meth)acrylate, norbornyl(meth)acrylate, isonorbornyl(meth)acrylate, adamantyl (meth)acrylate, dimethyladamantyl(meth)acrylate, tricyclo[5.2.1.0$^{2,6}$]decyl (meth)acrylate, tetracyclo[4.4.0.1$^{2,5}$.1$^{7,10}$]dodecyl(meth)acrylate. A compound in which a substituent such as a hydroxyl group, a hydroxymethyl group, a carboxyl group and an oxo group is bonded to a group corresponding to R$^{44}$ of these compounds is also preferable.

[Monomer Unit of the Formula (IIIf)]

A monomer constituting a monomer unit of the formula (IIIf) includes maleic anhydride.

[Monomer Unit of the Formula (IIIg)]

As typical examples of the monomer corresponding to the monomer unit of the formula (IIIg), there may be mentioned the following compounds. 4-oxatricyclo[5.2.1.0$^{2,6}$]decan-8-en-5-one, 3-oxatricyclo[5.2.1.0$^{2,6}$]decan-8-en-4-one, 5-oxatricyclo[6.2.1.0$^{2,7}$]undecan-9-en-6-one, 4-oxatricyclo[6.2.1.0$^{2,7}$]undecan-9-en-5-one, 4-oxapentacyclo[6.5.1.1$^{9,12}$.0$^{2,6}$.0$^{8,13}$]pentadecan-10-en-5-one, 3-oxapentacyclo[6.5.1.1$^{9,12}$.0$^{2,6}$.0$^{8,13}$]pentadecan-10-en-4-one, 5-oxapentacyclo[6.6.1.1$^{10,13}$.0$^{2,7}$.0$^{9,14}$]hexadecan-11-en-6-one, 4-oxapentacyclo[6.6.1.1$^{10,13}$.0$^{2,7}$.0$^{9,14}$]hexadecan-11-en-5-one.

[Monomer Unit of the Formula (IIIh)]

As typical examples of the monomer corresponding to the monomer unit of the formula (IIIh), there may be mentioned the following compounds. norbornene, 5-hydroxy-2-norbornene.

In order to obtain a polymeric compound of the present invention, a polymerization of a monomer mixture can be performed by a known method in order to produce an acryl polymer and so on such as a solution polymerization, a bulk polymerization, a suspension polymerization, a bulk-suspension polymerization and a emulsion polymerization and a solution polymerization is particularly preferable. In addition, a dropwise polymerization is preferable in a solution polymerization. In detail, the dropwise polymerization is performed by the methods, for example, such as (i) a method that each of a monomer solution solved in an organic solvent and a polymerization initiator solution solved in an organic solvent is prepared in advance and each of the monomer solution and polymerization initiator solution is dropped into a an organic solvent maintained at a constant temperature, (ii) a method that a mixed solution solved a monomer and a polymerization initiator in an organic solvent is dropped into a an organic solvent maintained at a constant temperature and (iii) a method that each of a monomer solution solved in an organic solvent and a polymerization initiator solution solved in an organic solvent is prepared in advance and the polymerization initiator solution is dropped into the monomer solution maintained at a constant temperature.

As a polymerization solvent, a known solvent can be used and there may be mentioned, for example, an ether (a linear-chained ether such as diethyl ether and a glycol ether such as propylene glycol monomethyl ether and a cyclic ether such as tetrahydrofuran and dioxane), an ester (methyl acetate, ethyl acetate, butyl acetate, ethyl lactate and a glycolether ester such as propyleneglycol monomethylether acetate), a ketone (acetone, methylethylketone, methylisobutylketone, cyclohexanone and others) an amide (N,N-dimethylacetoamide, N,N-dimethylfolmamide and others), a sulfoxide (dimethylsulfoxide and others), an alcohol (methanol, ethanol, propanol and others), a hydrocarbon (an aromatic hydrocarbon such as benzene, toluene and xylene, an aliphatic hydrocarbon such as hexane and an alicyclic hydrocarbon such as cyclohexane), a mixed solvent of these and so on. Further, a known polymerization initiator can be used as a polymerization initiator. A polymerization temperature can be, for example selected from a scope of about 30 to 150° C. without any restriction.

A polymer obtained by polymerization can be purified by precipitation or re-precipitation. A solvent of precipitation or re-precipitation may be either an organic solvent or water and further maybe a mixed solvent. As an organic solvent of used in precipitation or re-precipitation, there may be mentioned, for example, a hydrocarbon (an aliphatic hydrocarbon such as pentane, hexane, heptane and octane; an alicyclic hydrocarbon such as cyclohexane and methylcyclohexane; an aromatic hydrocarbon such as benzene, toluene and xylene), a halogenated-hydrocarbon (a halogenated-aliphatic hydrocarbon such as methylene chloride, chloroform and carbon tetrachloride; a halogenated-aromatic hydrocarbon such as chlorobenzene and dichlorobenzene; others), a nitro compound (such as nitro methane and nitro ethane), a nitrile (such as acetonitrile and benzonitrile), an ether (a linear chained ether such as diethylether, diisopropylether and dimethoxyethane; a cyclic ether such as tetrahydrofuran and dioxane), a ketone (such as acetone, methylethylketone and diisobutylketone), an ester (such as ethylacetate and butylacetate), a carbonate (such as dimethylcarbonate, diethylcarbonate, ethylenecarbonate and propylenecarbonate), an alcohol (such as methanol, ethanol, propanol, isopropylalcohol and butanol), a carboxylic acid (such as acetic acid), a mixed solvent containing these solvent and so on.

As an organic solvent used as the precipitation or re-precipitation solvent in these, a solvent containing at least one hydrocarbon (particularly an aliphatic hydrocarbon such as hexane) is preferable. In like a solvent containing at least one hydrocarbon, a ratio of a hydrocarbon (for example, an aliphatic hydrocarbon) and another solvent is, for example, former/later (volume ratio; 25° C.)=10/90 to 99/1, preferably former/later (volume ratio; 25° C.)=30/70 to 98/2 and more preferably former/later (volume ratio; 25° C.)=about 50/50 to 97/3.

A photoresist resin composition of the present invention contains the polymeric compound of present invention and a photo-acid generator.

As a photo-acid generator, a conventional compound, namely known, effectively providing acid by the action of exposure, for example, a diazonium salt, an iodonium salt (for example, diphenyl iodo hexafluorophosphate and so on), a sulfonium salt (for example, triphenyl sulfonium hexafluoroantimonate, triphenyl sulfonium hexafluorophosphate, triphenyl sulfonium methane sulfonate and so on), a sulfonic acid ester [for example, 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, 1-phenyl-1-(4-methylphenylsulfonyloxymethyl)-1-hydroxy-1-benzoylmethane and so on], an oxathiazol derivative, s-triazine derivative, a disulfone derivative (such as diphenyldisulfone), an imide compound, an oxime sulfonate, diazonaphtoquinone, benzoin tosylate and others can be applied. These photo-acid generators can be used by alone or in combination of 2 or more sorts.

The amount of photo-acid generator can be appropriately selected depending on strength of the acid generated by photo-exposure, a ratio of each monomer unit (repeated unit) of the polymer and others, and for example, from 0.1 to 30 part by weight, preferably from 1 to 25 part by weight, and preferably from about 2 to 20 part by weight, relative to 100 part by weight of the polymeric compound.

A photoresist resin composition may contain an alkali soluble component such as an alkali soluble resin (for example, a novolac resin, a phenol resin, an imide resin, carboxyl group-containing resin and so on), a coloring agent (for example, dyes), an organic solvent (for example, such as hydrocarbons, halogenated hydrocarbons, alcohols, esters, amides, ketones, ethers, cellosolves, carbitols, glycol ether esters, and mixed solvent of them) and others.

After the photoresist resin composition is coated on a base or substrate and dried, the applied film (resist film) is exposed to light through a predetermined mask (or, further baked after exposure) to form a latent pattern, and is subsequently developed to form a fine pattern with a high degree of precision.

As a base or substrate, there may be mentioned silicon wafer, metal, plastics, glass, ceramic and so on. The photoresist resin composition can be applied using a conventional application means such as a spin coater, a dip coater, a roller coater. The applied film has a thickness of, for example, from 0.01 to 20 μm, and preferably from about 0.05 to 2 μm.

Light rays with different wavelengths such as ultraviolet rays and X-rays can be used in exposure and g-light, i-light, excimer laser (for example, XeCl, KrF, KrCl, ArF, ArCl, $F_2$, $Kr_2$, KrAr, $Ar_2$ and so on) are usually used for semiconductor resist. An exposure energy is, for example, about 0.1 to about 1000 mJ/cm$^2$.

Light irradiation allows the photosensitive acid generator to generate an acid, and the acid allows, for example, the protective group (eliminating group) of carboxyl group and so on of the monomer unit (alkali-soluble unit) having the acid-eliminating group of the polymeric compound to leave promptly and thereby yields a carboxyl group that contributes to solubilization. Therefore, development with water or an alkaline developing solution can yield a predetermined pattern with a high degree of precision.

EXAMPLES

The present invention will be illustrated in more detail with reference to several examples below, which is not intended to limit the scope of the invention.

Example 1

Synthesis of a Resin of Following Structure

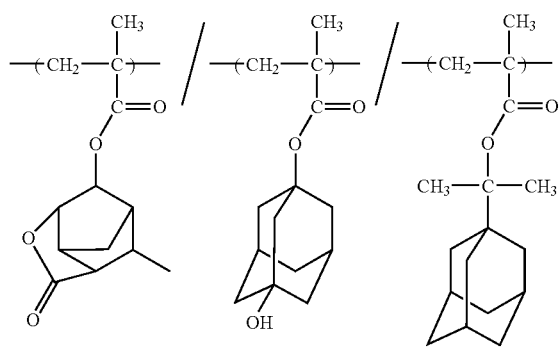

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.30 g of 9-methacryloyloxy-5-methyl-2-oxatricyclo[4.2.1.0$^{4,8}$] nonan-3-one, 3.60 g of 1-hydroxy-3-methacryloyloxyadamantane, 4.05 g of 1-(1-methacryloyloxy-1-methylethyl)adamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 12.8 g of the target product was obtained. In the obtained polymer, the weight average molecular weight (Mw) was 9500 and the molecular-weight distribution (Mw/Mn) was 1.82 (the measured value of GPC, in terms of polystyrene).

Example 2

Synthesis of a Resin of Following Structure

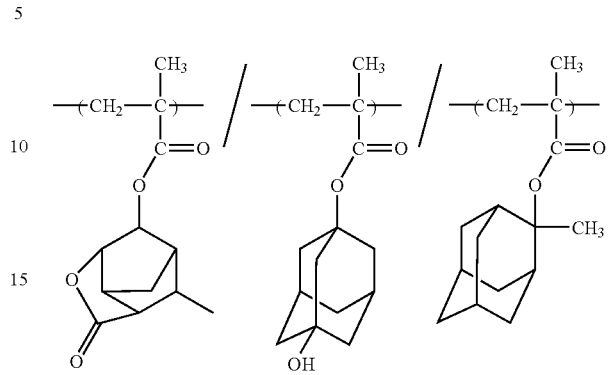

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.52 g of 9-methacryloyloxy-5-methyl-2-oxatricyclo[4.2.1.0$^{4,8}$] nonan-3-one, 3.76 g of 1-hydroxy-3-methacryloyloxyadamantane, 3.73 g of 2-methacryloyloxy-2-methyladamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 11.7 g of the target product was obtained. In the obtained polymer, the weight average molecular weight (Mw) was 9800 and the molecular-weight distribution (Mw/Mn) was 1.79 (the measured value of GPC, in terms of polystyrene).

Example 3

Synthesis of a Resin of Following Structure

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.11 g of 9-methacryloyloxy-5-methyl-2-oxatricyclo[4.2.1.0$^{4,8}$]

nonan-3-one, 7.89 g of 1-(1-methacryloyloxy-1-methyl-ethyl)adamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 12.7 g of the target product was obtained. In the obtained polymer, the weight average molecular weight (Mw) was 9500 and the molecular-weight distribution (Mw/Mn) was 1.85 (the measured value of GPC, in terms of polystyrene).

Example 4

Synthesis of a Resin of Following Structure

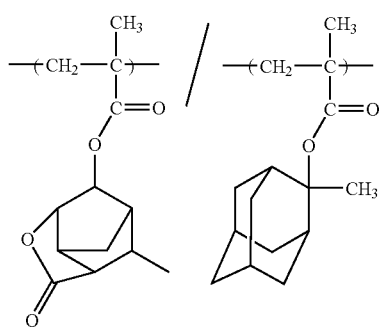

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.53 g of 9-methacryloyloxy-5-methyl-2-oxatricyclo[4.2.1.0$^{4,8}$] nonan-3-one, 7.47 g of 2-methacryloyloxy-2-methyladamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 11.3 g of the target product was obtained. In the obtained polymer, the weight average molecular weight (Mw) was 9300 and the molecular-weight distribution (Mw/Mn) was 1.77 (the measured value of GPC, in terms of polystyrene).

Comparative Example 1

Synthesis of a Resin of Following Structure

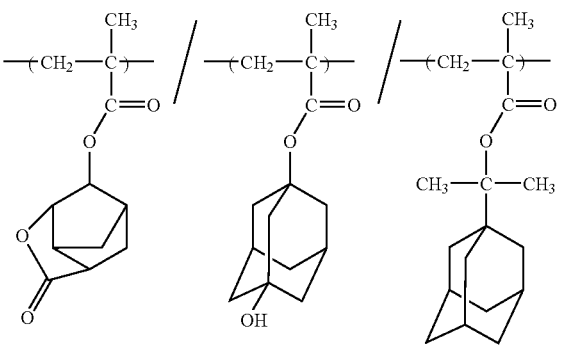

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.07 g of 9-methacryloyloxy-2-oxatricyclo[4.2.1.0$^{4,8}$]nonan-3-one, 3.76 g of 1-hydroxy-3-methacryloyloxyadamantane, 4.17 g of 1-(1-methacryloyloxy-1-methylethyl)adamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 13.0 g of the target product was obtained. In the obtained polymer, the weight average molecular weight (Mw) was 9400 and the molecular-weight distribution (Mw/Mn) was 1.79 (the measured value of GPC, in terms of polystyrene).

Comparative Example 2

Synthesis of a Resin of Following Structure

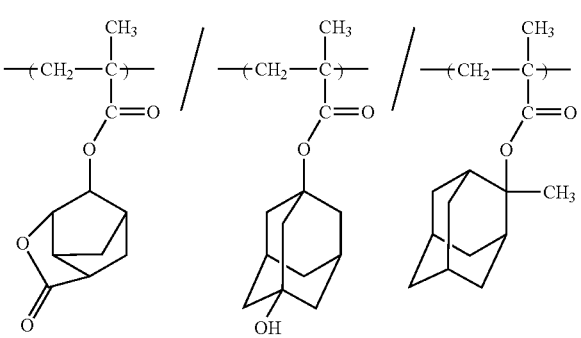

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.29 g of 9-methacryloyloxy-2-oxatricyclo[4.2.1.0$^{4,8}$]nonan-3- one, 3.87 g of 1-hydroxy-3-methacryloyloxyadamantane, 3.84 g of 2-methacryloyloxy-2-methyladamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 11.2 g of the target product was obtained. In the obtained polymer, the weight average molecular weight (Mw) was 9300 and the molecular-weight distribution (Mw/Mn) was 1.80 (the measured value of GPC, in terms of polystyrene).

Comparative Example 3

Synthesis of a Resin of Following Structure

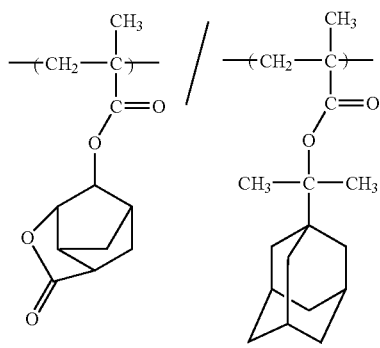

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 6.88 g of 9-methacryloyloxy-2-oxatricyclo[4.2.1.0$^{4,8}$]nonan-3-one, 8.12 g of 1-(l-methacryloyloxy-1-methylethyl)adamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 12.8 g of the target product was obtained. In the obtained polymer, the weight average molecular weight (Mw) was 9600 and the molecular-weight distribution (Mw/Mn) was 1.81 (the measured value of GPC, in terms of polystyrene).

Comparative Example 4

Synthesis of a Resin of Following Structure

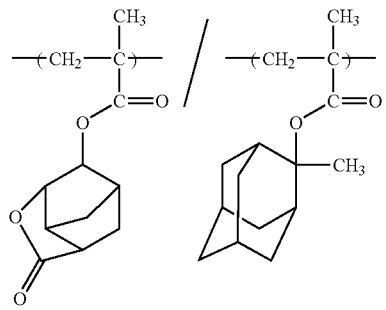

In a separable flask equipped with a stirrer, a thermometer, a dropping funnel and a inlet pipe of nitrogen, 16.5 g of each of propyleneglycol monomethylether acetate (PGMEA) and propyleneglycol monomethylether (PGME) was added and after rising the temperature to 85° C., a mixed solution of 7.30 g of 9-methacryloyloxy-2-oxatricyclo[4.2.1.0$^{4,8}$]nonan-3-one, 7.70 g of 2-methacryloyloxy-2-methyladamantane, 0.60 g of dimethyl-2,2'-azobis(2-methylpropionate) (the initiator; made by WAKO JUNYAKU Industry, commercial name "V-601"), 34.2 g of PGMEA and 34.2 g of PGME was dropped for 4 hours. After dropping, aging was carried out for 2 hrs. The resulting reaction mixture was dropped into a mixed liquid of 733 g of heptane and 81 g of ethyl acetate and the precipitated polymer was recovered with a nuche. The obtained polymer was dried under reduced pressure and 11.1 g of the target product was obtained. In the obtained polymer, the weight average molecular weight (Mw) was 9800 and the molecular-weight distribution (Mw/Mn) was 1.78 (the measured value of GPC, in terms of polystyrene).

Valuation Test 1 (Solubility Test with Resist Solvent)

Each of the polymers obtained in the above Examples and Comparative Examples is dissolved by pre-determined concentration in PGMEA which is a resist solvent, observed by the naked eye and solubility of polymer is valuated by the following standards. The result is described in the Table 1.
○: perfectly soluble
Δ: soluble but cloudy a little
X: insoluble, polymer is precipitated

TABLE 1

| | PGMEA 10% by weight solution | PGMEA 20% by weight solution |
|---|---|---|
| Example 1 | ○ | ○ |
| Example 2 | ○ | ○ |
| Example 3 | ○ | ○ |
| Example 4 | ○ | ○ |
| Comparative Example 1 | x | Δ |
| Comparative Example 2 | x | Δ |
| Comparative Example 3 | x | Δ |
| Comparative Example 4 | x | Δ |

Valuation Test 2

For each of the polymers obtained in the above Examples, 100 parts by weight of the polymer and 10 parts by weight of triphenylsulfonium hexafluoroantimonate were mixed with a solvent, propyleneglycol monomethyl ether (PGME), to prepare a photoresist resin composition of 17% by weight polymer-concentration. This composition was coated onto a silicon wafer by spin coating method 10 and a photosensitive layer of 1.0-μm thickness was formed. The photosensitive layer was subjected to prebaking on a hot plate at a temperature of 100° C. for 150 seconds and then was exposed to light through a mask by using KrF excimer laser having a wavelength of 247 nm at an irradiance of 30 mJ/cm² and then the exposed layer was subjected to post-baking at a temperature of 100° C. for 60 seconds. Then, it was subjected to development in a 0.3 M aqueous tetramethylammonium hydroxide solution for 60 seconds and was rinsed with pure water. As a result, a pattern with a 0.20-μm line and space was obtained clearly and accurately.

INDUSTRIAL APPLICABILITY

A polymeric compound of the present invention has not only high substrate adhesion and etching resistance and but also high solubility for a resist solvent. Therefore, according to the photoresist resin composition of the present invention and the process of producing semi-conductor of the present invention, a micro pattern can be formed high accurately.

The invention claimed is:

1. A polymeric compound containing at least one monomer unit represented by the following formula (I);

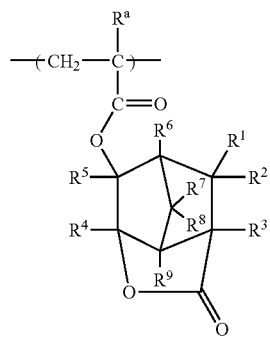
(I)

wherein $R^a$ is a hydrogen atom, a halogen atom, an alkyl group of 1 to 6 carbon atoms or an haloalkyl group of 1 to 6 carbon atoms; each of $R^1$ and $R^2$ is identical to or different from a hydrogen atom or a hydrocarbon group, provided that at least one of $R^1$ and $R^2$ is a hydrocarbon group; $R^1$ and $R^2$ may be bonded together to form a ring with an adjacent carbon atom; and each of $R^3$, $R^4$, $R^5$, $R^6$, $R^7$, $R^8$ and $R^9$ is identical to or different from a hydrogen atom or a hydrocarbon group, and wherein a content of the monomer unit represented by the formula (I) is 10 to 90 mole-% and a weight-average molecular weight (Mw) of the polymeric compound is 5000 to 50,000.

2. The polymeric compound according to claim 1, wherein the polymeric compound further contains a monomer unit having a group changing to alkali soluble by eliminating in part.

3. The polymeric compound according to claim 1 or claim 2, wherein the polymeric compound further contains a monomer unit which can provide adhesion to a base, provided that the monomer unit represented by the formula (I) is excluded.

4. The polymeric compound according to claim 1, wherein the polymeric compound contains at least one monomer unit represented by the formula (I) and at least one monomer unit selected from the following formulae (IIa) to (IIh):

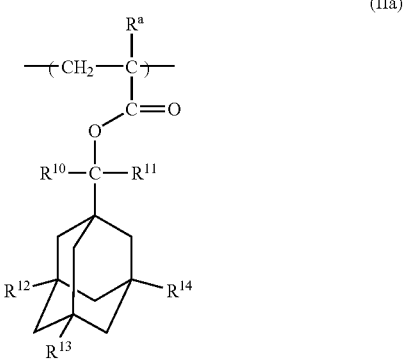
(IIa)

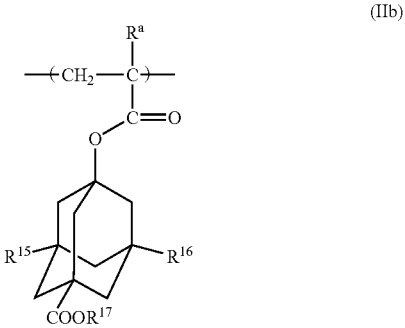
(IIb)

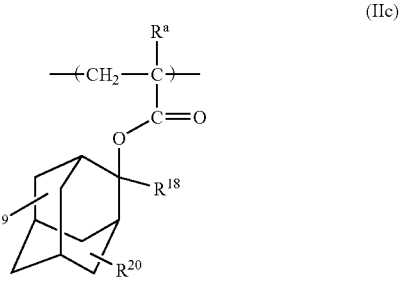
(IIc)

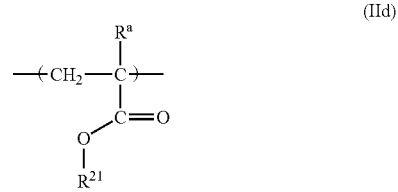
(IId)

(IIe)

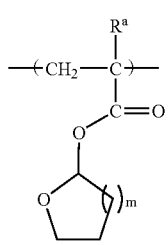

(IIf)

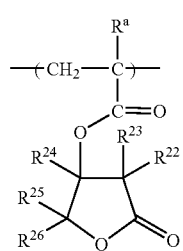

(IIg)

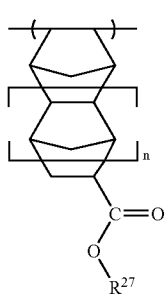

(IIh)

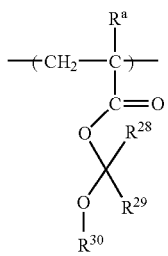

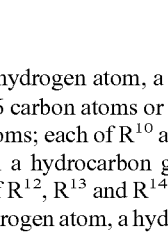

wherein $R^a$ is a hydrogen atom, a halogen atom, an alkyl group of 1 to 6 carbon atoms or an haloalkyl group of 1 to 6 carbon atoms; each of $R^{10}$ and $R^{11}$ is identical to or different from a hydrocarbon group of 1 to 8 carbon atoms; each of $R^{12}$, $R^{13}$ and $R^{14}$ is identical to or different from a hydrogen atom, a hydroxyl group or a methyl group; each of $R^{15}$ and $R^{16}$ is identical to or different from a hydrogen atom, a hydroxyl group or a —$COOR^{17}$ group, $R^{17}$ is a t-butyl group, a 2-tetrahydrofuranyl group, a 2-tetrahydropyranyl group or a 2-oxepanyl group; $R^{18}$ is a methyl group or an ethyl group; each of $R^{19}$ and $R^{20}$ is identical to or different from a hydrogen atom, a hydroxyl group or an oxo group; $R^{21}$ is a hydrocarbon group which has a tertiary carbon atom at a bonding position with an oxygen atom shown in the formula and which may have a substituent; each of $R^{22}$, $R^{23}$, $R^{24}$, $R^{25}$ and $R^{26}$ is identical to or different from a hydrogen atom or a methyl group; $R^{27}$ is a t-butyl group, a 2-tetrahydrofuranyl group, a 2-tetrahydropyranyl group or a 2-oxepanyl group; each of $R^{28}$ and $R^{29}$ is identical to or different from a hydrogen atom, an alkyl group or a fluoroalkyl group; $R^{30}$ is a hydrogen atom or an organic group; m denotes an integer of 1 to 3 and n denotes 0 or 1.

5. The polymeric compound according to claim 1, wherein the polymeric compound further contains at least one monomer unit selected from the following formulae (IIIa) to (IIIh):

(IIIa)

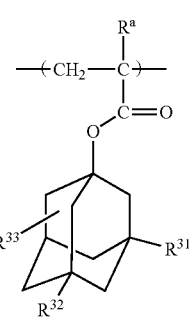

(IIIb)

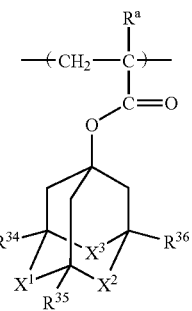

(IIIc)

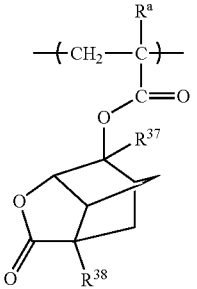

(IIId)

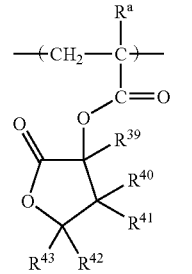

-continued

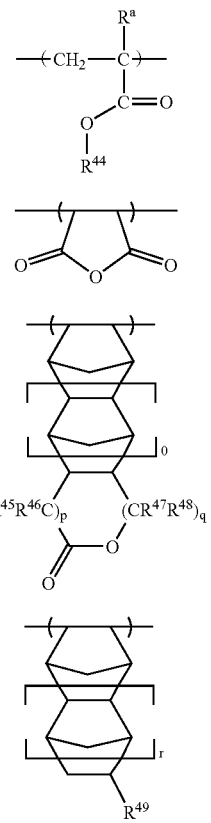

(IIIe)

(IIIf)

(IIIg)

(IIIh)

wherein $R^a$ is a hydrogen atom, a halogen atom, an alkyl group of 1 to 6 carbon atoms or an haloalkyl group of 1 to 6 carbon atoms; each of $R^{31}$ and $R^{32}$ is identical to or different from a hydrogen atom, a hydroxyl group or a carboxyl group; and $R^{33}$ is a hydroxyl group, an oxo group or a carboxyl group; each of $X^1$, $X^2$ and $X^3$ is identical to or different from —$CH_2$— or —CO—O—; each of $R^{34}$, $R^{35}$ and $R^{36}$ is identical to or different from a hydrogen atom or a methyl group; each of $R^{37}$ and $R^{38}$ is identical to or different from a hydrogen atom or a methyl group; each of $R^{39}$, $R^{40}$, $R^{41}$, $R^{42}$ and $R^{43}$ is identical to or different from a hydrogen atom or a methyl group; $R^{44}$ is a hydrogen atom or a linear, branched, cyclic or bridged cyclic hydrocarbon group of 1 to 20 carbon atoms which may have a substituent; each of $R^{45}$, $R^{46}$, $R^{47}$ and $R^{48}$ is identical to or different from a hydrogen atom or a methyl group; $R^{49}$ is a hydrogen atom, a hydroxyl group, a hydroxymethyl group or a carboxyl group; each of o, p, q and denotes 0 or 1.

6. A photoresist resin composition which comprises at least the polymeric compound according to claim 1 and a photo-acid generator.

7. A process of producing a semi-conductor which comprises a step wherein the photoresist resin composition according to claim 6 is coated on a substrate or a base to form a resist film and a pattern is formed through exposure and development.

* * * * *